US010884026B2

(12) United States Patent
Shi et al.

(10) Patent No.: US 10,884,026 B2
(45) Date of Patent: Jan. 5, 2021

(54) VERTICAL PROBE CARD

(71) Applicant: TWINSOLUTION TECHNOLOGY (SUZHOU) LTD, Jiangsu (CN)

(72) Inventors: Yuanjun Shi, Jiangsu (CN); Kai Liu, Jiangsu (CN)

(73) Assignee: TWINSOLUTION TECHNOLOGY (SUZHOU) LTD, Jiangsu (CN)

( * ) Notice: Subject to any disclaimer, the term of this patent is extended or adjusted under 35 U.S.C. 154(b) by 195 days.

(21) Appl. No.: 16/314,902

(22) PCT Filed: Nov. 6, 2017

(86) PCT No.: PCT/CN2017/109587
§ 371 (c)(1),
(2) Date: Jan. 3, 2019

(87) PCT Pub. No.: WO2018/209901
PCT Pub. Date: Nov. 22, 2018

(65) Prior Publication Data
US 2019/0250190 A1  Aug. 15, 2019

(30) Foreign Application Priority Data

May 18, 2017 (CN) .......................... 2017 1 0352127

(51) Int. Cl.
*G01R 31/00*  (2006.01)
*G01R 1/073*  (2006.01)
(Continued)

(52) U.S. Cl.
CPC ....... *G01R 1/07314* (2013.01); *G01R 1/0408* (2013.01); *G01R 1/06716* (2013.01);
(Continued)

(58) Field of Classification Search
CPC ............ G01R 31/2889; G01R 1/07378; G01R 1/07342; G01R 1/07314; G01R 3/00;
(Continued)

(56) References Cited

U.S. PATENT DOCUMENTS

2006/0250149 A1  11/2006  Lan
2011/0050264 A1  3/2011  Kurosawa
(Continued)

FOREIGN PATENT DOCUMENTS

CN       201464507 U     5/2010
CN       101930016 A     12/2010
(Continued)

OTHER PUBLICATIONS

International Search Report for PCT/CN2017/109587.
International Search Report for PCT/CN2017/109587 dated: Feb. 23, 2018.

*Primary Examiner* — Raul J Rios Russo
(74) *Attorney, Agent, or Firm* — Schmeiser, Olsen & Watts, LLP

(57) ABSTRACT

Provided is a vertical probe card, the vertical probe card includes: a printed circuit board (PCB) including a bottom hole and a PCB pad surrounding the bottom hole; a cover plate disposed on the PCB and including a cover hole, where the cover hole and the bottom hole are disposed coaxial with each other and form a receiving space; and a probe received in the receiving space. The probe includes a probe head passing through the cover hole to extend out of the cover plate and to contact with a chip, where an end, which is provided with the probe head, of the probe is a first end; and a protruding portion disposed in the mid-portion of the probe and in contact with the PCB pad, where a part between the probe head and the protruding portion of the probe and the protruding portion are conductors.

20 Claims, 5 Drawing Sheets

(51) Int. Cl.
    *H05K 1/11*     (2006.01)
    *G01R 1/067*     (2006.01)
    *H05K 1/18*     (2006.01)
    *G01R 31/28*     (2006.01)
    *G01R 3/00*     (2006.01)
    *G01R 1/04*     (2006.01)
    *G01R 31/26*     (2020.01)

(52) U.S. Cl.
    CPC ..... *G01R 1/06733* (2013.01); *G01R 1/07342* (2013.01); *G01R 1/07378* (2013.01); *G01R 3/00* (2013.01); *G01R 31/2889* (2013.01); *H05K 1/111* (2013.01); *H05K 1/182* (2013.01); *G01R 1/07307* (2013.01); *G01R 31/2601* (2013.01); *H05K 2201/10151* (2013.01)

(58) Field of Classification Search
    CPC .............. G01R 1/0408; G01R 1/07307; G01R 31/2601; G01R 1/06733; G01R 1/06716; G01R 1/06772; G01R 1/06755; H05K 1/111; H05K 1/182; H05K 2201/10151
    USPC ......... 324/71, 378, 403, 415, 425, 500, 537, 324/756.01, 756.03
    See application file for complete search history.

(56) References Cited

U.S. PATENT DOCUMENTS

| | | | |
|---|---|---|---|
| 2014/0028342 A1 | 1/2014 | Brandorff | |
| 2015/0015287 A1 | 1/2015 | DeBauche et al. | |
| 2016/0305982 A1* | 10/2016 | Hung | G01R 31/2886 |
| 2019/0361050 A1* | 11/2019 | Felici | G01R 1/0735 |
| 2019/0361051 A1* | 11/2019 | Vettori | G01R 1/0735 |

FOREIGN PATENT DOCUMENTS

| | | |
|---|---|---|
| CN | 103328993 A | 12/2010 |
| CN | 201789125 U | 4/2011 |
| CN | 103328993 A | 9/2013 |
| CN | 204347079 U | 5/2015 |
| CN | 105358991 A | 2/2016 |
| CN | 205484443 U | 8/2016 |
| CN | 206020466 U | 3/2017 |
| CN | 206020606 U | 3/2017 |
| TW | I261672 B | 9/2006 |
| TW | I449918 B | 8/2014 |

* cited by examiner

VERTICAL PROBE CARD

CROSS-REFERENCES TO RELATED APPLICATIONS

This application claims priority to PCT Application No. PCT/CN2017/109587, filed on Nov. 6, 2017, which is based upon and claims priority to Chinese Patent Application No. 201710352127.3, filed on May 18, 2017, the entire contents both of which are incorporated herein by reference.

FIELD OF TECHNOLOGY

The following relates to a probe card technology field, for example, to a vertical probe card.

BACKGROUND

Before a chip is packaged, an electrical die sorting (EDS) is usually performed. According to an EDS test result, a qualified chip can be packaged. The EDS is implemented by a tester equipped with various measurement software and test instruments and a prober station loaded with probe cards. During the test, each probe of a probe card is in direct contact with a die pad of a wafer to achieve electrical connection between the die pad of the wafer and the tester, thereby achieving a purpose of testing electrical characteristics of the semiconductor chip. A common vertical probe card includes a test head and a printed circuit board (PCB), where the test head includes an upper cover of the test head, a lower cover of the test head and a probe, the probe is placed in the upper cover and the lower cover of the test head. During the test, an upper end and a lower end of the probe contact the die pad and PCB pad respectively, thereby achieving signal conduction. The signal is transmitted through the test probe, but a signal loss caused by the resistance or inductance of the test probe itself affects the accuracy of the test, especially in a high frequency test (for example, a signal frequency used in the test is 10-40 GHz) where a larger signal attenuation is caused and the test is limited.

SUMMARY

An aspect relates to a vertical probe card, which solves the problem in which the above-mentioned test on chips is poor in accuracy.

A vertical probe card includes a PCB, a cover plate, a probe and a protruding portion.

The PCB includes a bottom hole and a PCB pad surrounding the bottom hole.

The cover plate is disposed on the PCB and includes a cover hole, where the cover hole and the bottom hole are coaxial with each other and form a receiving space.

The probe is received in the receiving space and includes a probe head passing through the cover hole to extend out of the cover plate and to contact a chip, where an end, which is provided with the probe head, of the probe, is a first end.

The protruding portion is disposed between the first end and a second end opposite to the first end of the probe and in contact with the PCB pad, where a part between the probe head and the protruding portion of the probe and the protruding portion are conductors.

Optionally, the distance between the probe head and the protruding portion is less than or equal to ½ of the length of the probe.

Optionally, a diameter of the bottom hole is less than an outer diameter of the protruding portion, and the minimum diameter of the cover hole is less than the outer diameter of the protruding portion.

Optionally, the outer diameter of the protruding portion is less than or equal to that an outer diameter of the PCB pad.

Optionally, the probe further includes a probing rod and a probe holder, where the probe holder includes an accommodating space for receiving the probing rod and an elastic element, where the elastic element is disposed between the probing rod and the probe holder, and the elastic element is preset to give the probing rod a tension towards the probe head.

Optionally, the probe holder includes a cap, and the protruding portion is disposed on and integrally formed with the cap.

Optionally, the probe holder further includes a seat, and the cap is fixedly connected to the seat.

Optionally, the probe holder further includes a seat, and the cap is detachably connected to the seat.

Optionally, the protruding portion is annular, an inner side of the cap is provided with an internal thread at a position corresponding to the protruding portion, the seat is provided with an external thread at an end facing the cap, and the cap and the seat are connected by the internal thread and the external thread.

Optionally, the protruding portion includes a taper angle, and the taper angle is used for limiting a position of the probe.

Optionally, the taper angle is fabricated by a hemming process.

Optionally, the probe holder further includes a seat, and the cap is integrally formed with the seat.

Optionally, the cap is a conductor, the elastic element is an insulator, and the seat is an insulator.

Optionally, a positioning device is further included to fixedly connect the cover plate and the PCB, the positioning device includes a positioning hole disposed on the cover plate and a positioning column disposed on the PCB, and the positioning hole is matched with the positioning column.

Optionally, a surface of the PCB pad is a smooth plane or a rough plane.

Optionally, the vertical probe card includes N probes, the PCB includes N PCB layers, N is a positive integer greater than 1, the N PCB layers are stacked, the protruding portion of each probe is in contact with a respective one of N PCB pads on a surface, which is opposite to the cover plane, of the first PCB layer; the second end of the ith probe is in contact with a PCB pad on a surface, which is opposite to the (i−1)th PCB layer, of the ith PCB layer, and i is greater than 1 and less than or equal to N.

A signal can be transmitted by the vertical probe card provided by the embodiment of the present disclosure without having to pass through the entire probe, shortening the signal transmission distance and thereby reducing signal loss during transmission through the probe. This vertical probe card is particularly suitable for high frequency signal transmission.

BRIEF DESCRIPTION

Some of the embodiments will be described in detail, with reference to the following figures, wherein like designations denote like members, wherein.

Figure 1:
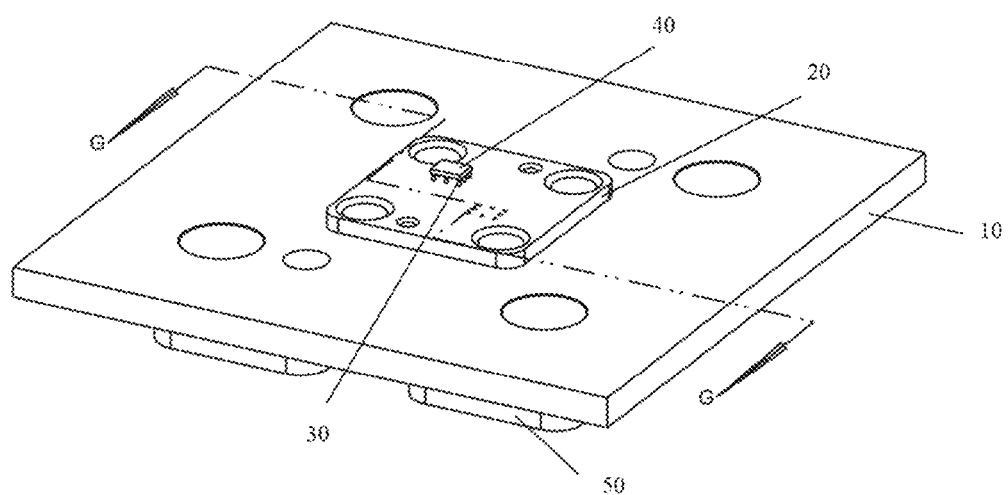
FIG. 1 is a perspective view of a vertical probe card according to an embodiment of the present disclosure.

In the accompanying drawings: PCB 10, bottom hole 11, PCB pad 12, positioning column 13, connecting member 14/23, cover plate 20, cover hole 21, positioning hole 22/51, probe 30, probing rod 31, probe head 311, probe holder 320, cap 32, protruding portion 321, seat 33, elastic element 34, chip 40, die pad 41, and tray 50.

DETAILED DESCRIPTION

The disclosure is further described in conjunction with the following embodiments and accompanying drawings.

Referring to FIGS. 1-5, an embodiment provides a vertical probe card for performing EDS on a chip to determine whether the chip is qualified before the chip is packaged. The vertical probe card includes a PCB 10, a cover plate 20 and a probe 30.

Figure 2:
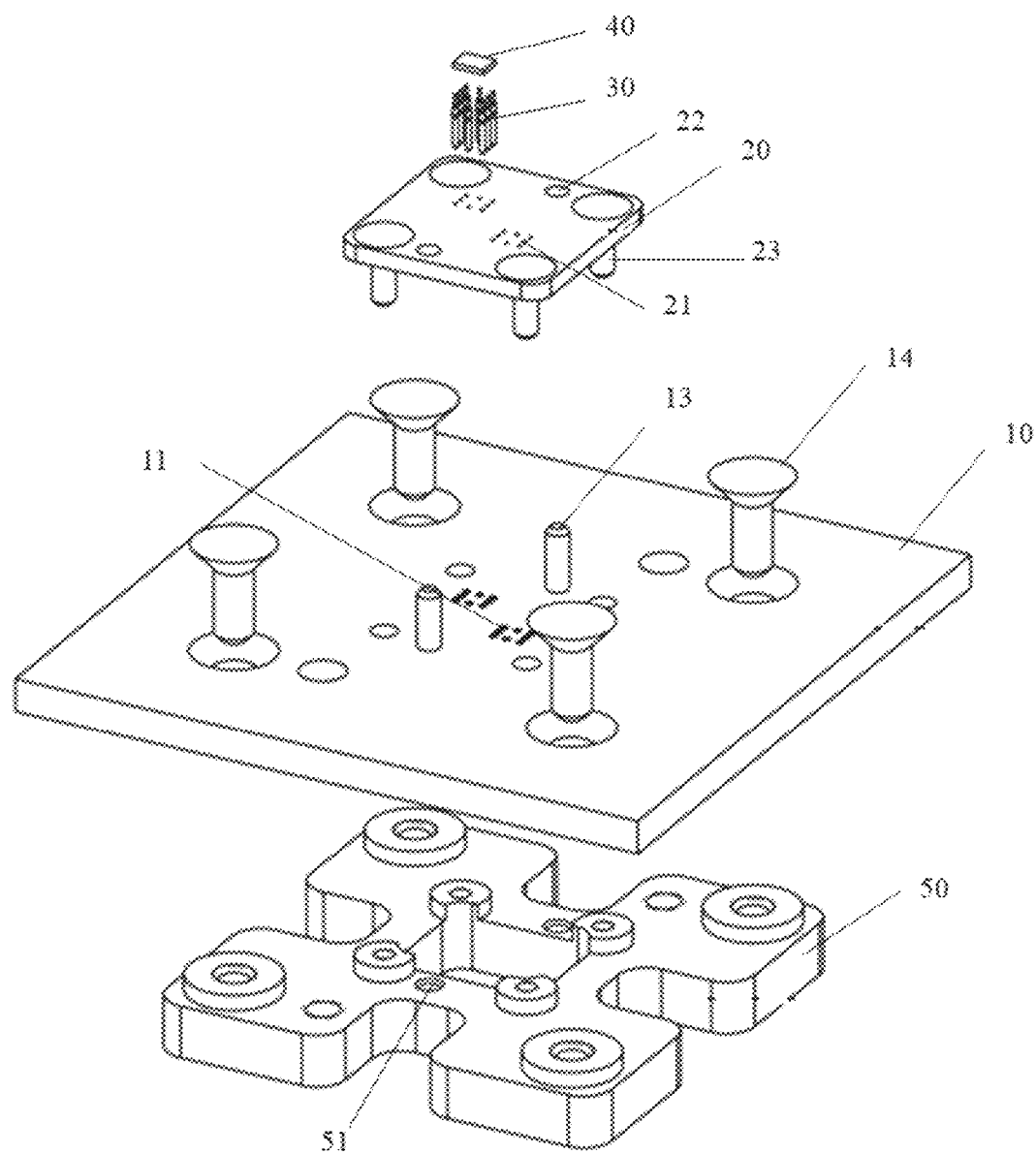
FIG. 2 is an exploded view of FIG. 1.
Figure 3:
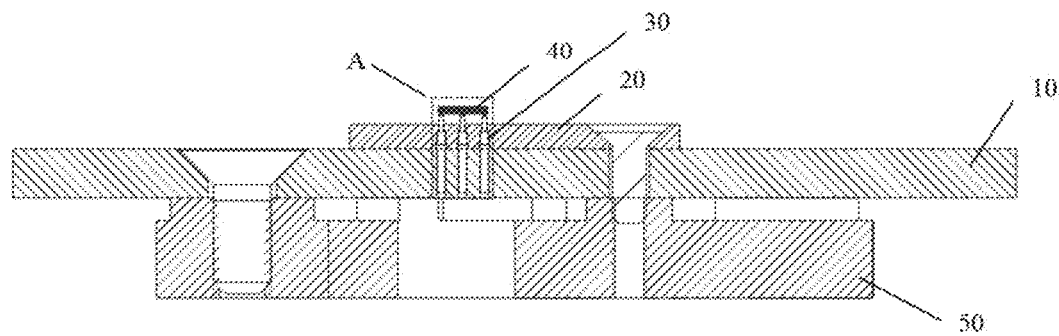
FIG. 3 is a sectional view of FIG. 1 taken along the section G-G.
Figure 4:
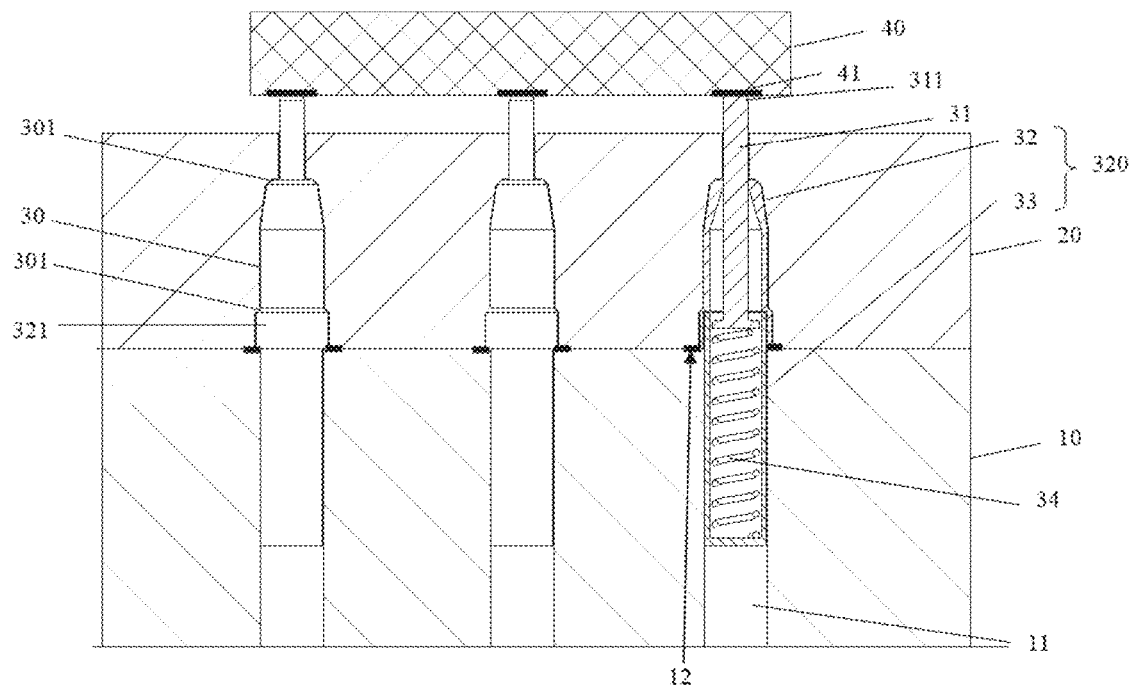
FIG. 4 is an enlarged view of the area A of FIG. 3.
Figure 5:
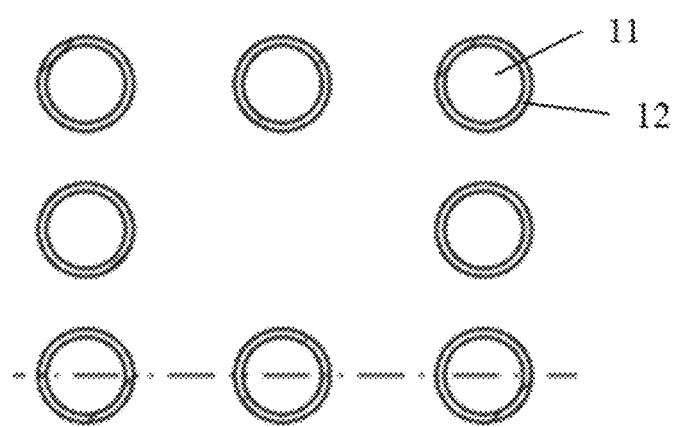
FIG. 5 is a top view of a bottom hole of a PCB of a vertical probe card according to an embodiment of the present disclosure.

Referring to FIGS. 2 and 4, the PCB 10 includes a substrate, and the substrate is provided with a bottom hole 11 and a PCB pad 12 surrounding the bottom hole 11. It can be understood that the substrate may be one of various PCB substrates in the existing art, and usually these substrates are made of insulating materials. Optionally, the substrate is one of a bakelite plate, a glass fiberboard, and various plastic sheets. In some other embodiments, the substrate may also be a composite sheet of multi-layer materials, such as a sheet-like material in which glass fibers, non-woven materials and resin are laminated.

The surface of the substrate is further provided with a wire connected to the PCB pad 12, and the wire is covered with a protective film. Generally, the protective film is a solder mask layer to prevent solder and other impurities from causing accidental connection between the wires. Optionally, the solder mask layer covers all surfaces of the substrate except the PCB pad 12.

Optionally, to facilitate mounting the probe 30 in the bottom hole 11, the bottom hole 11 has a diameter of 0.1 mm to 5 mm, and the PCB pad 12 has a larger diameter than the bottom hole 11. Optionally, the diameter of the PCB pad 12 is larger than that of the bottom hole 11 by 0.1 mm to 2 mm. It can be understood that in order for the probe 30 to be in good contact with the PCB pad 12 corresponding to the probe 30, the PCB pad 12 uses copper foil. Optionally, the PCB pad 12 may also be surface-treated to prevent surface oxidation of the PCB pad 12, the surface treatment may be at least one of hot air solder leveling (HASL), electroless nickel immersion gold (ENIG), immersion silver, immersion tin, and organic solderability preservative (OSP), and the surface of the pad 12 may be a smooth plane or a plane having a rough shape such as a serration or a protrusion to increase the contact reliability of the probe 30 and the PCB pad 12.

Optionally, the number of bottom holes 11 is multiple, and the multiple bottom holes 11 are arranged in an array on the substrate, and therefore, the PCB pads 12 are also arranged in an array on the substrate.

Optionally, the bottom hole 11 may be a blind hole or a through hole according to the practical needs. For example, the bottom hole 11 is a through hole to accommodate the probe 30 having different lengths.

Optionally, the surface of the substrate is further provided with a silkscreen for marking a name and a position frame of each part on the surface of the substrate, so as to facilitate maintenance and identification after assembly.

The PCB 10 is provided with a cover plate 20, the cover plate 20 is provided with a cover hole 21, the cover hole 21 penetrates through the cover plate 20, and the cover hole 21 is disposed correspondingly and coaxially with the bottom hole 11 so that the cover hole 21 and the bottom hole 11 form a receiving space for arranging the probe 30. Optionally, the inner wall of the cover hole 21 is an insulating material to prevent conduction between the probe 30 and other probes 30. Optionally, the cover plate 20 is made of an insulating material.

Optionally, when the bottom holes 11 are arranged in an array on the substrate, the cover holes 21 are also arranged in an array on the cover plate 20.

Optionally, the cover plate 20 is detachably connected to the PCB 10, the cover plate 20 and the PCB 10 are detachably connected by connecting members 14. In the embodiment, each of the connecting members 14 are bolts, and of course, other conventional detachable members 14, such as snaps and screws, may also be feasible.

To facilitate the connection and positioning of the cover plate 20 and the PCB 10, a positioning device is further disposed between the cover plate 20 and the PCB 10. The positioning device includes a positioning hole 22 disposed on the cover plate 20 and a positioning column 13 disposed on the PCB 10. The positioning hole 22 is matched with the positioning column 13 and used for positioning the cover plate 20 and the PCB 10 when the positioning column 13 is inserted into the positioning hole 22.

The probe 30 is received in the receiving space formed by the bottom hole 11 and the cover hole 21. Optionally, the probe 30 includes a probe head 311, the probe head 311 passes through the cover hole 21 to extend out of the cover plate 20 and to contact a chip 40; at least a part of a probing rod 31 of the probe 30 is received in the bottom hole 11 to secure the probe 30; the probe 30 includes a protruding portion 321 disposed in the middle of the probe 30, when the probe 30 is disposed in the receiving space, the protruding portion 321 is in contact with the PCB pad 12 to transmit a signal through the probing rod 31 between the probe head 311 and the protruding portion 321. It can be understood that a part between the probe head 311 and the protruding portion 321 of the probe 30 should be a conductor, and since the distance between the probe head 311 and the protruding portion 321 is less than the length of the probe 30, the signal does not need to pass through the entire probe, shortening the signal transmission distance, thereby reducing the signal loss during transmission through the probe 30. Optionally, the distance between the probe head 311 and the protruding portion 321 is less than or equal to ½ of the length of the probe 30, and by way of example, the distance between the probe head 311 and the protruding portion 321 is less than or equal to ⅓ of the length of the probe 30. Of course, it is also feasible that the probing rod 31 is a conductor. Optionally, the conductor is a metal conductor or a non-metallic conductor, the metal conductor may be copper, copper alloy, gold, gold alloy, silver or silver alloy, and the non-metallic conductor may be graphite or the like.

To further reduce the signal transmission loss, the probe rod between the probe 311 and the protruding portion 321 is a low-resistance conductor, such as a gold material or a copper material.

Optionally, the chip 40 is provided with a die chip 41, and the probe head 311 is used for contacting the die chip 41.

In the embodiment, the diameter of the bottom hole 11 is less than the outer diameter of the protruding portion 321 to prevent the probe 30 from falling into the bottom hole 11. The minimum diameter of the cover hole 21 is less than the outer diameter of the protruding portion 321 to prevent the probe 30 from coming out of the cover hole 21. Optionally, the cover hole 21 is a tapered hole, and the protruding portion 321 has a taper angle 301 or a part, which passes through the cover hole 21, of the probe 30 has a taper angle 301 to better keep the probe 30 held between the bottom hole 11 and the cover hole 21. Optionally, the taper angle 301 is fabricated by a crimping process.

Optionally, the outer diameter of the protruding portion 321 is less than or equal to that of the PCB pad 12 so that the protruding portion 321 can maintain contact with the PCB pad 12. Optionally, the protruding portion 321 is annular and sleeved on the probing rod 31.

Optionally, to make the chip 40 in better contact with the probe head 311, the probe 30 further includes the probing rod 31 and a probe holder 320. The probe holder 320 has a cylindrical shape and includes an accommodating space, the probing rod 31 is received in the accommodating space, and the probe head 311 is disposed at one end of the probing rod 31. It can be understood that the probe head 311 passes through and is exposed outside the probe holder 320. An elastic element 34 is disposed between the probing rod 31 and the probe holder 320, and is preset to give the probing rod 31 a tension towards the probe head 311. When the chip 40 needs to be tested, a downward pressure (towards the probe head 311) can be applied to the chip 40 to keep the probe head 311 and the die pad 41 pressed under the tension of the elastic element 34, thereby keeping the probe head 311 in close contact with the die chip 41. It can be understood that the elastic element 34 may be a spring, a rubber pad, an elastic wire or the like.

Optionally, the probe holder 320 includes a cap 32 and a seat 33, and the cap 32 is detachably connected to the seat 33. The cap 32 is in the shape of hollow tube, and the seat 33 is in the shape of hollow cylinder. The cap 32 is collinear with the axis of the seat 33, forming the accommodating space of the probe holder 320. The detachable connection may be threaded connection, clamping connection, etc. The cap 32 and the seat 33 may also be fixedly connected, such as riveting or welding. Optionally, the riveting may refer to that a protrusion (or a groove) is disposed on a side, which is opposite to the seat 33 (that is, the side is facing the seat 33), of the cap 32, and a groove (or a protrusion) is correspondingly disposed on a side, which is opposite to the cap 32 (that is, the side is facing the cap 32), of the seat 33, so that the cap 32 and the seat 33 are engaged by the groove and the protrusion. Optionally, the cap 32 is integrally formed with the seat 33. Optionally, the elastic element 34 is disposed in the accommodating space of the probe holder 320, one end of the elastic element 34 is in contact with the probing rod 31, and the elastic element 34 is preset to give the probing rod 31 the tension towards the probe head 311 to facilitate contact between the probing rod 31 and the die pad 41.

Optionally, the cap 32 includes the protruding portion 321, and the protruding portion 321 is annular. The inner side of the cap 32 is provided with an internal thread at a position corresponding to the protruding portion 321, and the seat 33 is provided with an external thread at the end facing the cap. The cap 32 and the seat 33 are connected by the internal thread and the external thread.

In the embodiment, the probing rod 31 is kept in contact with the cap 32 so that the signal can pass through the probing rod 31 and the cap 32. On the other hand, to make the probing rod 31 move in the accommodating space, the diameter of the probing rod 31 is substantially equal to the inner diameter of the cap 32. Optionally, the probing rod 31 and the cap 32 are made of copper, copper alloy, gold or gold alloy materials to minimize signal transmission loss and improve wear resistance.

Optionally, the protruding portion 321 is integrally formed with the cap 32.

Optionally, the cap 32 is a conductor.

Optionally, to reduce interference during signal transmission, both the elastic element 34 and the seat 33 are insulators.

Optionally, a tray 50 is further disposed under the PCB 10, and the tray 50 generally uses a high-strength rigid body such as a metal material or a glass material to strengthen the strength of the PCB 10 and prevent the PCB 10 from being deformed during use.

In the embodiment, a connecting member 23 is further disposed between the tray 50 and the PCB 10 to detachably connect the PCB 10 to the tray 50. The connecting member 23 may be a clamp, a bolt, a screw, etc. Of course, a positioning device is further disposed between the PCB 10 and the tray 50. The positioning device includes a positioning column 13 disposed on the PCB 10 and a positioning hole 51 disposed on the tray 50 and cooperating with the positioning column.

Figure 6:
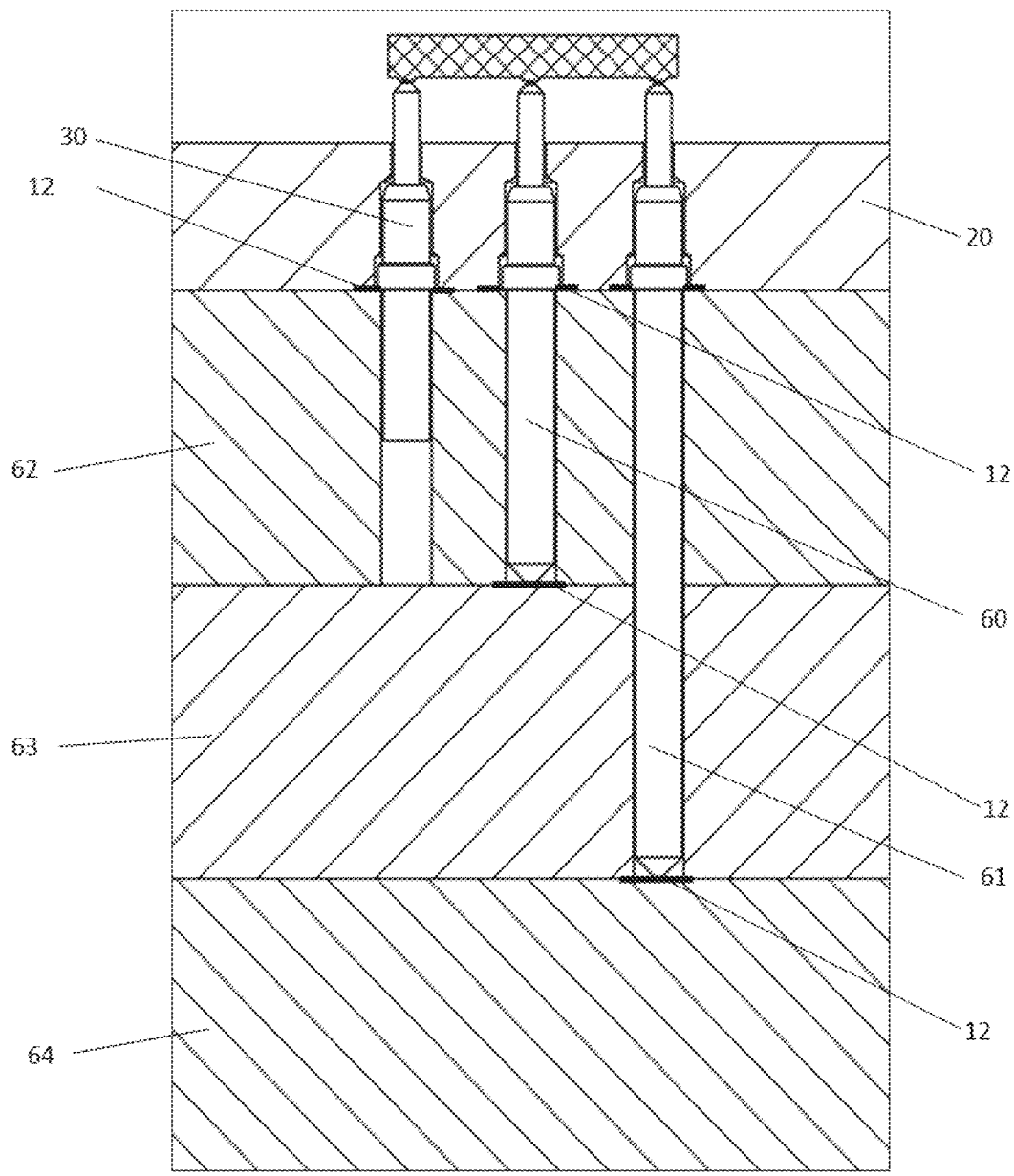
FIG. 6 is a sectional view of another vertical probe card according to an embodiment of the present disclosure.

FIG. 6 is a sectional view of another vertical probe card according to an embodiment. As shown in FIG. 6, in the embodiment, a vertical probe card having a relatively large number of chip pins is provided. When the number of the chip pins is relatively small, the internal wiring of the PCB is well distributed. When the number of the pins is relatively large, the internal wiring of the PCB is inconvenient to design or even impossible to design. At this time, it is necessary to design a multi-layered PCB. As shown in FIG. 6, the first PCB layer 62 and the second PCB layer 63 are adjacent and pressed together, and may be pressed together by a special method. The second PCB layer 63 and the third PCB layer 64 are adjacent and pressed together. Similarly, the multi-layered PCB is assembled. In practical application, the protrusion in the middle of the first probe 30 is in contact with the pad on the first PCB layer 62, the tail part of the second probe 60 is in contact with the pad on the second PCB layer 63, and the tail part of the third probe 61 is in contact with the pad on the third PCB layer 64. The first PCB layer 62, the second PCB layer 63 and the third PCB layer 64 may be a substrate or a flexible circuit board made of common materials. The tail part of the above probe refers to the end opposite to the probe head of the probe.

INDUSTRIAL APPLICABILITY

A signal can be transmitted by the vertical probe card provided by the present disclosure without having to pass through the entire probe, shortening the signal transmission distance and thereby reducing signal loss during transmission through the probe. This vertical probe card is particularly suitable for high frequency signal transmission.

Although the present invention has been disclosed in the form of preferred embodiments and variations thereon, it will be understood that numerous additional modifications and variations could be made thereto without departing from the scope of the invention.

For the sake of clarity, it is to be understood that the use of 'a' or 'an' throughout this application does not exclude a plurality, and 'comprising' does not exclude other steps or elements.

What is claimed is:

1. A vertical probe card, comprising:
   a printed circuit board (PCB) comprising a bottom hole and a PCB pad surrounding the bottom hole;
   a cover plate disposed on the PCB and comprising a cover hole, wherein the cover hole and the bottom hole are disposed coaxial with each other and form a receiving space;
   a probe received in the receiving space and comprising: a probe head passing through the cover hole to extend out of the cover plate and to contact a chip, wherein an end, which is provided with the probe head, of the probe is a first end; and
   a protruding portion disposed in a mid-portion of the probe and in contact with the PCB pad, wherein a part between the probe head and the protruding portion of the probe and the protruding portion are conductors.

2. The vertical probe card of claim 1, wherein a distance between the probe head and the protruding portion is less than or equal to ½ of a length of the probe.

3. The vertical probe card of claim 1, wherein a diameter of the bottom hole is less than an outer diameter of the protruding portion, and a minimum diameter of the cover hole is less than the outer diameter of the protruding portion.

4. The vertical probe card of claim 3, wherein the outer diameter of the protruding portion is less than or equal to an outer diameter of the PCB pad.

5. The vertical probe card of claim 4, wherein the probe further comprises:
   a probing rod and a probe holder, wherein the probe holder comprises an accommodating space for receiving the probing rod; and
   an elastic element, wherein the elastic element is disposed between the probing rod and the probe holder and preset to give the probing rod a tension towards the probe head.

6. The vertical probe card of claim 5, wherein the probe holder comprises a cap, and the protruding portion is disposed on and integrally formed with the cap.

7. The vertical probe card of claim 6, wherein the probe holder further comprises a seat, and the cap is fixedly connected to the seat.

8. The vertical probe card of claim 6, wherein the probe holder further comprises a seat, and the cap is detachably connected to the seat.

9. The vertical probe card of claim 8, wherein the protruding portion is annular, an inner side of the cap is provided with an internal thread at a position corresponding to the protruding portion, the seat is provided with an external thread at an end facing the cap, and the cap and the seat are connected by the internal thread and the external thread.

10. The vertical probe card of claim 6, wherein the probe holder further comprises a seat, and the cap is integrally formed with the seat.

11. The vertical probe card of claim 7, wherein the protruding portion comprises a taper angle, and the taper angle is used for limiting a position of the probe.

12. The vertical probe card of claim 11, wherein the taper angle is fabricated by a hemming process.

13. The vertical probe card of claim 7, wherein the cap is a conductor, the elastic element is an insulator, and the seat is an insulator.

14. The vertical probe card of claim 13, further comprising:
   a positioning device used for fixedly connecting the cover plate and the PCB, wherein the positioning device comprises a positioning hole disposed on the cover plate and a positioning column disposed on the PCB, and the positioning hole is matched with the positioning column.

15. The vertical probe card of claim 14, wherein a surface of the PCB pad is a smooth plane or a rough plane.

16. The vertical probe card of claim 1, wherein the vertical probe card comprises N probes, the PCB comprises N PCB layers, N is a positive integer greater than 1, the N PCB layers are stacked;
   wherein a protruding portion of each of the N probes is in contact with a respective one of N PCB pads on a surface, which is opposite to the cover plate, of a first PCB layer; and
   wherein a second end of an ith one of the N probes is in contact with a PCB pad on a surface, which is opposite to an (i-1)th one of the N PCB layers, of an ith one of the PCB layers, and i is greater than 1 and less than or equal to N.

17. The vertical probe card of claim 8, wherein the cap is in a shape of hollow tube, the seat is in a shape of hollow cylinder, the cap is collinear with an axis of the seat so as to form an accommodating space of the probe holder.

18. The vertical probe card of claim 10, wherein the cap is integrally formed with the seat by riveting or welding.

19. The vertical probe card of claim 18, wherein when the cap is integrally formed with the seat by riveting, a protrusion is disposed on a side, facing the seat, of the cap, and a groove is disposed on a side, facing the cap, of the seat.

20. The vertical probe card of claim 16, wherein the vertical probe card comprises 3 probes and the PCB comprises 3 PCB layers;
   wherein 3 PCB pads are formed on the surface, which is opposite to the cover plate, of the first PCB layer and the protruding portion of each of the 3 probes is in contact with the respective one of 3 PCB pads; and
   wherein a second end of a second probe is contact with a PCB pad on a surface, which is opposite to the first PCB layer, of the second PCB layer; a second end of a third probe is contact with a PCB pad on a surface, which is opposite to the second PCB layer, of the third PCB layer.

* * * * *